(12) United States Patent
Kim

(10) Patent No.: US 9,484,880 B2
(45) Date of Patent: *Nov. 1, 2016

(54) VARIABLE CAPACITOR, IMPEDANCE MATCHING DEVICE, MOBILE TERMINAL THEREOF AND METHOD FOR MATCHING IMPEDANCE

(75) Inventor: Chang Wook Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 543 days.

This patent is subject to a terminal disclaimer.

(21) Appl. No.: 13/989,281

(22) PCT Filed: Nov. 7, 2011

(86) PCT No.: PCT/KR2011/008432
§ 371 (c)(1),
(2), (4) Date: May 23, 2013

(87) PCT Pub. No.: WO2012/070787
PCT Pub. Date: May 31, 2012

(65) Prior Publication Data
US 2013/0241665 A1    Sep. 19, 2013

(30) Foreign Application Priority Data
Nov. 25, 2010    (KR) .................. 10-2010-0118371

(51) Int. Cl.
*H03H 7/38* (2006.01)
*H01G 7/00* (2006.01)
*H03H 7/00* (2006.01)

(52) U.S. Cl.
CPC ................. *H03H 7/38* (2013.01); *H01G 7/00* (2013.01); *H03H 2007/008* (2013.01)

(58) Field of Classification Search
CPC .............................. H01G 5/16; H01G 5/18
USPC ........ 333/17.3; 361/277, 280, 281, 174, 274
See application file for complete search history.

(56) References Cited

U.S. PATENT DOCUMENTS

| 2002/0163398 A1 | 11/2002 | Kondo et al. | |
| 2007/0197180 A1* | 8/2007 | McKinzie, III | H03H 7/40 455/248.1 |
| 2009/0207549 A1 | 8/2009 | Shimanouchi et al. | |
| 2010/0116632 A1* | 5/2010 | Smith | B81B 7/04 200/181 |

FOREIGN PATENT DOCUMENTS

| JP | 2005-020231 A | 1/2005 |
| KR | 10-2009-0090283 A | 8/2009 |

OTHER PUBLICATIONS

International Search Report in International Application No. PCT/KR2011/008432, filed Nov. 7, 2011.

* cited by examiner

*Primary Examiner* — Stephen E Jones
(74) *Attorney, Agent, or Firm* — Saliwanchik, Lloyd & Eisenschenk

(57) ABSTRACT

Disclosed is an impedance matching device. Variable devices of the impedance matching device installed in a mobile terminal, such as a portable terminal, are configured to have a MEMS structure. The MEMS structure and other components are integrated as one package, so the manufacturing cost is reduced and the manufacturing efficiency is improved.

10 Claims, 8 Drawing Sheets

VARIABLE CAPACITOR, IMPEDANCE MATCHING DEVICE, MOBILE TERMINAL THEREOF AND METHOD FOR MATCHING IMPEDANCE

CROSS-REFERENCE TO RELATED APPLICATIONS

This application is the U.S. national stage application of International Patent Application No. PCT/KR2011/008432, filed Nov. 7, 2011, which claims priority to Korean Application No. 10-2010-0118371, filed Nov. 25, 2010, the disclosures of each of which are incorporated herein by reference in their entirety.

TECHNICAL FIELD

The embodiment relates to an impedance matching device and a mobile terminal including the same. In more detail, the embodiment relates to an impedance matching device installed in a mobile terminal, such as a portable phone, in which variable devices of a variable tuner module for matching impedance of an antenna are configured with a MEMS structure and the MEMS structure and other components are integrated as one package, thereby reducing the manufacturing cost and improving the manufacturing efficiency.

BACKGROUND ART

In a mobile communication system, an RF (radio frequency) block is designed to support various frequency bands. In particular, a variable capacitor having variable capacitance values with respect to each frequency band must be used as a capacitor for a filter directly related to the frequency band.

In addition, among components of the RF block, a voltage controlled oscillator (VCO) adjusts voltage applied to the variable capacitor to obtained variable capacitance, thereby changing the resonant frequency. The variable capacitor is a very important device for a tunable filter and the VCO of the RF block.

However, in the case of a tuner module circuit including the variable capacitor, the construction or specification of the devices may vary depending on manufacturers, causing the inefficiency of the suppliers and customers.

DISCLOSURE OF INVENTION

Technical Problem

The embodiment has been suggested to solve the above problems, and an object of the embodiment is to provide an impedance matching device, in which a variable capacitor is prepared in the form of a MEMS device and a tuner module consisting of a plurality of devices is integrated as one package, thereby removing the inefficiency of the suppliers and customers, which is caused because the construction or specification of the devices varies depending on manufacturers.

Solution to Problem

A variable capacitor according to the embodiment includes a first electrode on a substrate; a second electrode connected to a spring fixed to the substrate to float above the first electrode; a fixed electrode spaced apart from a lateral side of the second electrode on the substrate; and a movable electrode interposed between the second electrode and the fixed electrode and connected to the second electrode to physically make contact with the fixed electrode as voltage is applied to the fixed electrode, wherein a gap between the first and second electrodes is adjusted by varying voltage applied to the first electrode.

A variable capacitor according to the embodiment includes a first electrode on a substrate; a second electrode spaced apart from the first electrode; a third electrode floating above the first and second electrodes; fourth electrodes connected to the third electrode through a spring structure; and fifth electrodes fixedly aligned in opposition to the fourth electrodes to vary a capacitance value by adjusting a gap between the first and second electrodes and the third electrode as voltage is applied to the fourth electrodes.

An impedance matching device according to the embodiment includes a substrate; a variable device unit mounted on the substrate and including at least one MEMS variable capacitor to change a capacitance value according to applied voltage; a fixed device unit mounted on the substrate and including at least one inductor coupled with the MEMS variable capacitor to form a predetermined time constant; a reflective power measurement unit mounted on the substrate to measure an intensity of a reflective wave of a signal transmitted from the variable device unit and the fixed device unit; and a converting unit mounted on the substrate to output a direct current voltage value by converting the intensity of the reflective wave of the signal measured by the reflective power measurement unit into the direct current voltage value.

An impedance matching method according to the embodiment includes the steps of applying voltage to a variable device unit including a MEMS variable capacitor; transmitting a signal by using the variable device unit and a fixed device unit including at least one inductor coupled with the MEMS variable capacitor to form a predetermined time constant; measuring an intensity of a reflective wave of the transmitted signal; converting the measured intensity of the reflective wave into a direct current voltage value; and varying a capacitance by applying voltage from a controller to the variable device unit based on the converted direct current voltage value.

Advantageous Effects of Invention

According to the embodiment, the inefficiency to the suppliers and customers, which is caused because the construction or specification of the devices varies depending on manufacturers, can be removed.

MODE FOR THE INVENTION

Hereinafter, embodiments will be described in detail with reference to accompanying drawings.

Figure 1:
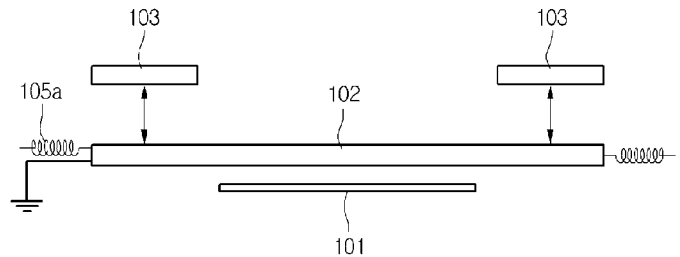
FIG. 1 is a schematic view for explaining a MEMS (micro electro mechanical system) variable capacitor according to the first embodiment.

FIG. 1 is a schematic view for explaining a MEMS (micro electro mechanical system) variable capacitor according to the first embodiment. The MEMS variable capacitor described in the following description may refer to a variable capacitor or a variable condenser including a varactor or a varicap.

According to the MEMS variable capacitor of the first embodiment, a second electrode 102 floats above a first electrode 101 and voltage is applied to a third electrode 103, which is fixed, so that a gap between the first and second electrodes 101 and 102 can be adjusted, thereby varying the capacitance value.

In detail, the MEMS variable capacitor according to the first embodiment includes the first electrode 101, the second electrode 102 floating above the first electrode 101 and the third electrode which is fixed to adjust the gap between the first and second electrodes 101 and 102 in order to vary the capacitance value.

The second electrode 102 may float above the first electrode 101 by spring structures 105a and 105b.

In addition, an RF signal is applied from the first electrode 101 to the second electrode 102.

Therefore, according to the MEMS variable capacitor of the present embodiment, the second electrode 102 is moved toward the third electrode 103 by applying the voltage to the third electrode 103 so that the gap between the first and second electrodes 101 and 102 can be adjusted.

At this time, as the second electrode 102 gradually goes to the third electrode 103, the second electrode 102 is gradually remote from the first electrode 101.

That is, if the voltage applied to the third electrode 103 is increased, the second electrode 102 becomes closer to the third electrode 103 and the second electrode 102 becomes away from the first electrode 101, so the capacitance value is gradually reduced.

Therefore, according to the MEMS variable capacitor of the first embodiment, the voltage is applied from the electrode, to which the RF signal is not applied, so the capacitance can be adjusted.

Figure 2:
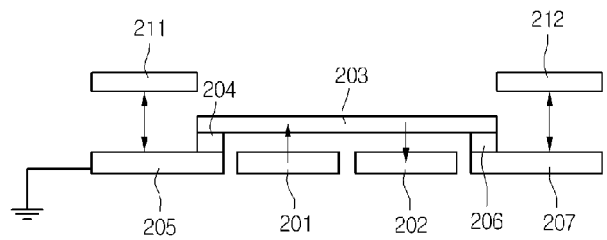
FIG. 2 is a schematic view for explaining a MEMS variable capacitor according to the second embodiment.

FIG. 2 is a schematic view for explaining a MEMS variable capacitor according to the second embodiment.

According to the MEMS variable capacitor of the second embodiment, first and second electrodes 201 and 202 are fixed, a third electrode 203 floats above the first and second electrodes 201 and 202, and voltage is applied to fifth electrodes 211 and 212, which are fixed, to adjust the gap between the first and second electrodes 201 and 202 and the third electrode 203, thereby varying the capacitance value.

In detail, the MEMS variable capacitor according to the second embodiment includes the first electrode 201, the second electrode 102 spaced apart from the first electrode 201, the third electrode 203 floating above the first and second electrodes 201 and 202, fourth electrodes 205 and 207 connected to the third electrode 203 by spring structures 204 and 206, and fifth electrodes 211 and 213 fixedly aligned in opposition to the fourth electrodes 205 and 207 to adjust the gap between the first and second electrodes 201 and 202 and the third electrode 203 as voltage is applied to the fourth electrodes 205 and 207 in order to vary the capacitance value.

Thus, as the voltage is applied from the fifth electrodes 211 and 212 to the fourth electrodes 205 and 207, the fourth electrodes 205 and 207 are moved toward the fifth electrodes 211 and 212 so that the third electrode 203 is away from the first and second electrodes 201 and 202.

Therefore, according to the second embodiment, the voltage is applied from the fifth electrodes 211 and 212, to which the RF signal is not applied, to adjust the gap between the first and second electrodes 201 and 202 and the third electrode 203, thereby varying the capacitance value.

In addition, according to the MEMS variable capacitor of the second embodiment, the RF signal is applied from the first electrode 201 to the third electrode 203 and then transferred from the third electrode 203 to the second electrode 202, so the high Q value can be obtained because the RF signal may not flow through the spring structures 204 and 206 supporting the third electrode 203 being floated.

Figure 3:
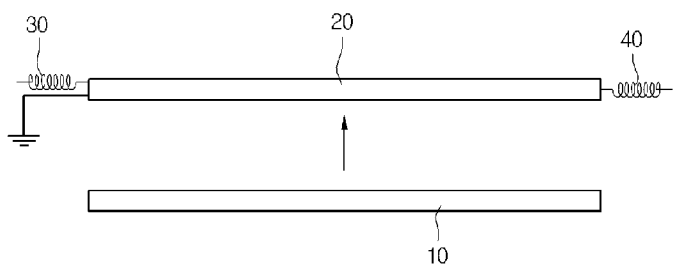
FIG. 3 is a schematic view for explaining a variable capacitor according to the comparative example.
Figure 4A:
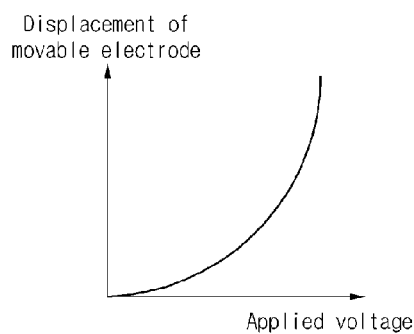
FIGS. 4a to 4c are graphs for explaining characteristics of a variable capacitor according to the comparative example.
Figure 4B:
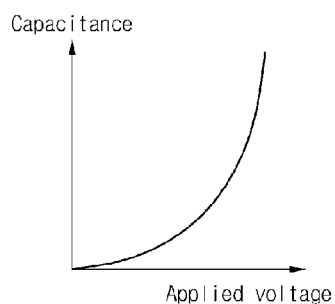
Figure 4C:
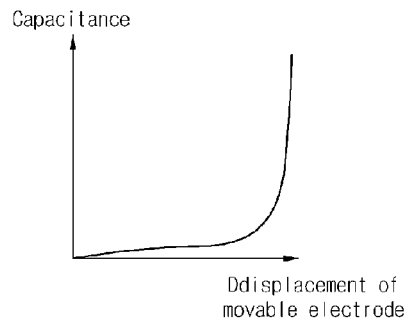

FIG. 3 is a schematic view for explaining a variable capacitor according to the comparative example. FIGS. 4a to 4c are graphs for explaining characteristics of the variable capacitor according to the comparative example.

The comparative example employs a general variable capacitor, in which first and second electrodes 10 and 20 are aligned while facing each other. As the voltage is applied to the first electrode 10, the second electrode 20, which is floated by mechanical springs 30 and 40, is pulled down so that the gap between the first and second electrodes 10 and 20 is adjusted, thereby varying the capacitance value.

Therefore, according to the comparative example, as shown in the graph of FIG. 4a, the displacement of the second electrode 20 serving as a movable electrode may rapidly increase as the applied voltage is constantly increased. In addition, as shown in the graph of FIG. 4b, the capacitance is also rapidly increased as the applied voltage is constantly increased. Further, as shown in the graph of FIG. 4c, the capacitance is suddenly increased as the displacement of the movable electrode is constantly increased.

As a result, according to the variable capacitor of the comparative example, the capacitance variation as a function of the applied voltage may have no linear characteristic, so that the consistent phase noise characteristic may not be obtained. Thus, the capacitance variation may not be controlled in the vicinity of the maximum value of the applied voltage.

Figure 5A:
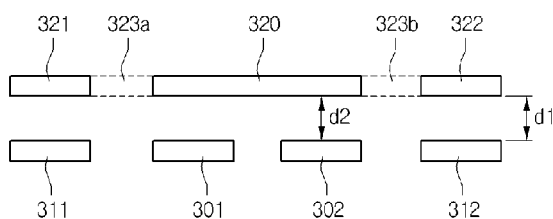
FIGS. 5a and 5b are schematic views for explaining a MEMS variable capacitor according to the third embodiment.
Figure 5B:
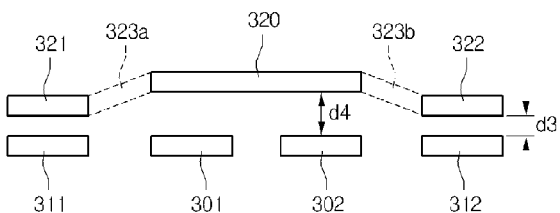
Figure 6A:
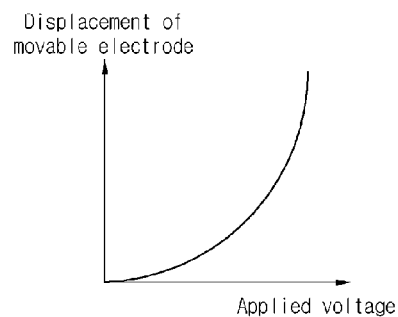
FIGS. 6a to 6c are graphs for explaining characteristics of a MEMS variable capacitor according to the third embodiment.
Figure 6B:
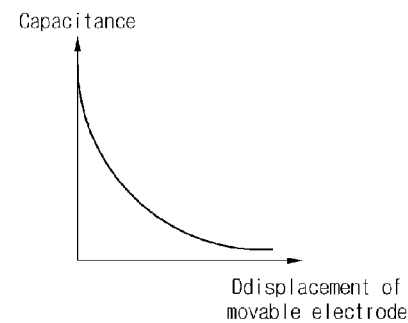
Figure 6C:
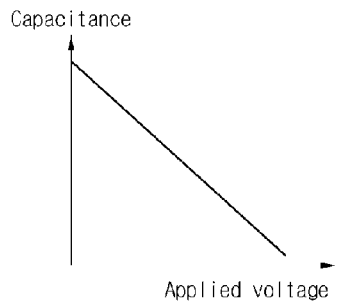

FIGS. 5a and 5b are schematic views for explaining a MEMS variable capacitor according to the third embodiment, and FIGS. 6a to 6c are graphs for explaining characteristics of the MEMS variable capacitor according to the third embodiment.

According to the MEMS variable capacitor of the third embodiment, a gap between a movable electrode and a fixed electrode is adjusted by moving the movable electrode, which floats with the seesaw structure, thereby varying the capacitance value.

In detail, the MEMS variable capacitor according to the third embodiment includes a first electrode 301, a second electrode 302 spaced apart from the first electrode 301, a third electrode 320 floating above the first and second electrodes 301 and 302, fourth electrodes 321 and 322 connected to the third electrode 320 through spring structures 323a and 323b, fifth electrodes 311 and 312 fixedly aligned in opposition to the fourth electrodes 321 and 322 to adjust the gap between the first and second electrodes 301 and 302 and the third electrode 320 as the voltage is applied to the fourth electrodes 321 and 322 in order to vary the capacitance value, and a support structure (not shown) to fix a part of the spring structures 323a and 323b.

According to the MEMS variable capacitor of the third embodiment, in the state shown in FIG. 5a, if the voltage is applied from the fifth electrodes 311 and 312 to the fourth electrodes 321 and 322, the fourth electrodes 321 and 322 are moved toward the fifth electrodes 311 and 312 as shown in FIG. 5b.

At this time, since the part of the spring structures 323a and 323b connecting the third electrode 320 to the fourth electrodes 321 and 322 is fixed by the support structure, the fourth electrodes 321 and 322 are closely moved to the fifth electrodes 311 and 312 and the third electrode 320 is away from the first and second electrodes 301 and 302 on the basis of the part of the spring structures 323a and 323b.

In detail, the gap between the first and second electrodes 301 and 302 and the third electrode 320 is enlarged from d2, which is the gap before the voltage is applied (see, FIG. 5a), to d4 which is the gap after the voltage is applied (see, FIG. 5b).

In addition, the gap between the fourth electrodes 321 and 322 and the fifth electrodes 311 and 312 is narrowed from d1, which is the gap before the voltage is applied (see, FIG. 5a), to d3 which is the gap after the voltage is applied (see, FIG. 5b).

Therefore, the MEMS variable capacitor according to the third embodiment can vary the capacitance value by adjusting the gap between the first and second electrodes 301 and 302 and the third electrode 320 by controlling the intensity of the voltage applied from the fifth electrodes 311 and 312 to the fourth electrodes 321 and 322.

In addition, in the MEMS variable capacitor according to the third embodiment, the RF signal is applied from the first electrode 301 to the third electrode 320 and then transferred from the third electrode 320 to the second electrode 302. Thus, the signal may not flow through the mechanical spring structures 323a and 323b, so the high Q value can be obtained.

Further, according to the MEMS variable capacitor of the third embodiment, the voltage is applied from the fifth electrodes 311 and 312, to which the RF signal is not applied, so that the gap between the first and second electrodes 301 and 302 and the third electrode 320 can be adjusted, thereby varying the capacitance value.

Meanwhile, according to the MEMS variable capacitor of the third embodiment, as shown in FIG. 6a, the displacement of the third electrode 320 serving as a movable electrode may rapidly increase as the applied voltage is constantly increased. However, as shown in the graph of FIG. 6b, the capacitance is rapidly decreased as the displacement of the movable electrode is constantly increased.

Therefore, as shown in the graph of FIG. 6c, the capacitance is linearly decreased as the applied voltage is constantly increased.

Thus, when comparing with the variable capacitor according to the comparative example, the MEMS variable capacitor according to the third embodiment represents the linear capacitance variation as a function of the applied voltage, so that the consistent phase noise characteristic may be obtained.

Figure 7:
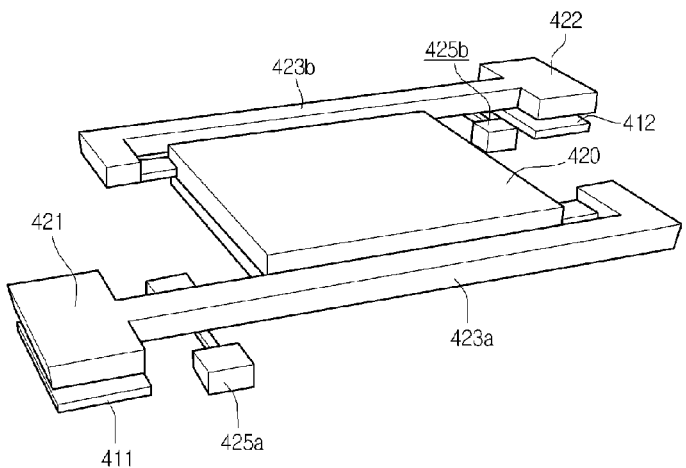
FIG. 7 is a perspective view showing one example of a MEMS variable capacitor according to the third embodiment.
Figure 8:
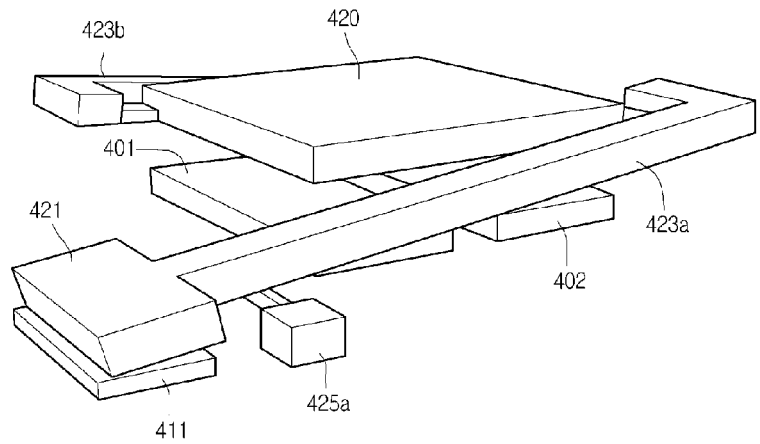
FIG. 8 is a perspective view for explaining variation of capacitance in the MEMS variable capacitor shown in FIG. 7.

FIG. 7 is a perspective view showing one example of a MEMS variable capacitor according to the third embodiment and FIG. 8 is a perspective view for explaining variation of capacitance in the MEMS variable capacitor shown in FIG. 7.

As shown in FIG. 7, according to one example of the MEMS variable capacitor of the third embodiment, a third electrode 420 has a rectangular shape and a pair of spring structures 423a and 423b are symmetrically provided at both sides of the third electrode 420.

In addition, fourth electrodes 421 and 422 are connected to the spring structures 423a and 423b, respectively, and parts of the spring structures 423a and 423b are fixed by support structures 425a and 425b, respectively.

Since the parts of the spring structures 423a and 423b are fixed by the support structures 425a and 425b, respectively, the third electrode 420, the spring structures 423a and 423b and the fourth electrodes 421 and 422 can be floated.

In addition, fifth electrodes 411 and 412 are fixedly aligned in opposition to the fourth electrodes 421 and 422, respectively, and first and second electrodes 401 and 402 are aligned below the third electrode 420 as shown in FIG. 8.

The term fix may include the fixation to a substrate (not shown) used for manufacturing the variable capacitor through the MEMS technology.

In this regard, the first and second electrodes 401 and 402 and the fifth electrodes 411 and 412 are fixed to the substrate.

Thus, as the voltage is applied from the fifth electrodes 411 and 412 to the fourth electrodes 421 and 422, the third electrode 420 is displaced above the first and second electrodes 401 and 402 through the seesaw operation as shown in FIGS. 7 and 8, so the gap between the first and second electrodes 401 and 402 and the third electrode 420 may be widened.

Figure 9:
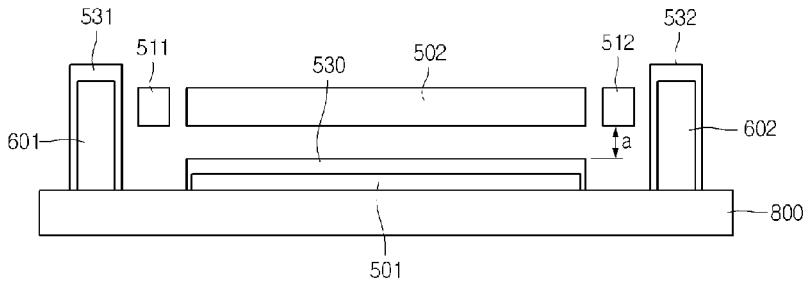
FIG. 9 is a schematic sectional view of a MEMS variable capacitor according to the embodiment.

FIG. 9 is a schematic sectional view of a MEMS variable capacitor according to the embodiment.

The MEMS variable capacitor according to the embodiment includes a first electrode 501, a second electrode 502 floating above the first electrode 501, a fixed electrode 601 spaced apart from a lateral side of the second electrode 502, and a movable electrode 511 interposed between the second electrode 502 and the fixed electrode 601 and connected to the second electrode 502 such that the movable electrode 511 can physically make contact with the fixed electrode 601 as voltage is applied to the fixed electrode 601.

The second electrode 502 is spaced upward from the top surface of the first electrode 501, so the second electrode 502 will be referred to as being floated above the first electrode 501.

For reference, a first insulating layer 530 is formed on the first electrode 501 and a gap between the first insulating layer 530 and the second electrode 502 is indicated as a in FIG. 9, so the second electrode 502 is spaced upward from the top surface of the first electrode 501 by a predetermined distance.

In addition, the first electrode 501 may be defined as a bottom electrode, and the second electrode 502 may be defined as a top electrode.

In the MEMS variable capacitor having the above structure, the gap between the first and second electrodes 501 and 502 can be variously adjusted by varying the voltage applied to the first electrode 501, so that the variable capacitor may have various capacitance values.

In addition, the movable electrode 511 can physically make contact with the fixed electrode 601 according to the voltage applied to the fixed electrode 601 to prevent the second electrode 502 from moving, so the gap between the first and second electrodes 501 and 502 may not vary.

At this time, if the RF signal is applied from the first electrode 501 to the second electrode 502, the RF signal may pass through the capacitor including the first electrode 501, an air layer and the second electrode 502.

The RF signal may also be applied from the second electrode 502 to the first electrode 501.

Thus, according to the MEMS variable capacitor of the embodiment, since the gap a between the first and second electrodes 501 and 502 is not changed, the capacitance may not be changed even if the power of the RF signal is changed.

In addition, according to the MEMS variable capacitor of the embodiment, since the gap between the first and second electrodes 501 and 502 is not changed, the capacitor may not be self-actuated even if the RF signal has high power.

Further, according to the MEMS variable capacitor of the embodiment, the gap between the first and second electrodes 501 and 502 can be adjusted by varying the voltage applied to the first electrode 501, so that the tuning range of the capacitor may not be reduced even if the power of the RF signal is increased.

Meanwhile, the MEMS variable capacitor of the embodiment can be manufactured through the MEMS technology. As shown in FIG. 9, the first electrode 501 and the fixed electrode 601 are formed on a substrate 800 and the second electrode 502 and the movable electrode 511 are connected to a spring (not shown) fixed to the substrate 800 in such a manner that the second electrode 502 can float above the first electrode 501. For instance, the substrate 800 may include a glass substrate or a silicon substrate.

In addition, since the first insulating layer 530 is formed on the first electrode 501, the electric short between the first and second electrodes 501 and 502 can be prevented. Further, since a second insulating layer 531 is formed on the fixed electrode 601, the electric short between the fixed electrode 601 and the movable electrode 511 can be prevented.

Further, as shown in FIG. 9, fixed electrodes 201 and 202 can be formed at both sides of the first and second electrodes 501 and 502.

In addition, a movable electrode 111 can be formed between the first electrode 501 and the fixed electrode 201 and a movable electrode 112 can be formed between the second electrode 502 and the fixed electrode 202.

In detail, a pair of fixed electrodes 601 and 202 and a pair of movable electrodes 511 and 112 can be provided.

If the voltage is not applied to the first electrode 501, the movable electrodes 111 and 112 are spaced apart from the second electrode 502 and the fixed electrodes 201 and 202.

Figure 10:
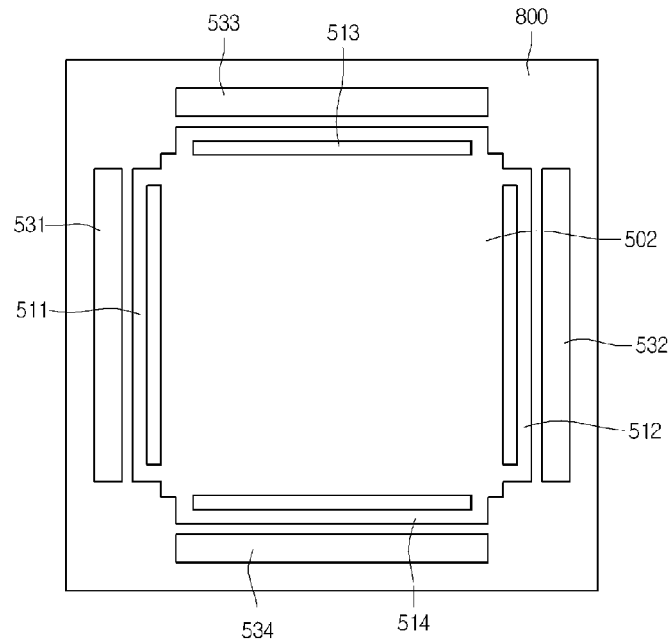
FIG. 10 is a schematic plan view showing a MEMS variable capacitor according to the embodiment.
Figure 11:
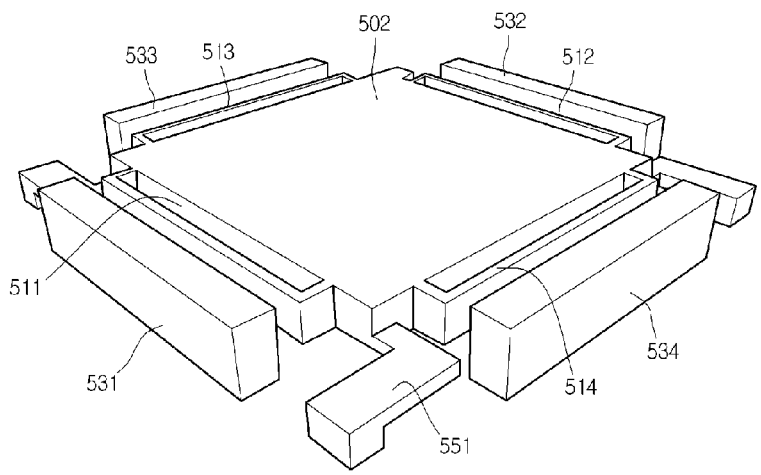
FIG. 11 is a schematic perspective view showing a MEMS variable capacitor according to the embodiment.

FIG. 10 is a schematic plan view showing a MEMS variable capacitor according to the embodiment and FIG. 11 is a schematic perspective view showing the MEMS variable capacitor according to the embodiment.

According to the MEMS variable capacitor of the embodiment, four movable electrodes 511, 512, 513 and 514 are connected to the second electrode 502 and four fixed electrodes (reference numerals are omitted) are aligned in opposition to the four movable electrodes 511, 512, 513 and 514.

FIG. 10 is the plan view of the MEMS variable capacitor showing second insulating layers 531, 532, 533 and 534 facing the four movable electrodes 511, 512, 513 and 514, in which the four fixed electrodes are not shown because they are aligned behind the second insulating layers 531, 532, 533 and 534.

In addition, both ends of the four movable electrodes 511, 512, 513 and 514 are connected to the second electrode 502.

Thus, as the voltage is applied to the first electrode (not shown and located below the second electrode 502), the four movable electrodes 511, 512, 513 and 514 physically make contact with the four fixed electrodes (reference numerals are omitted), respectively, thereby preventing the second electrode 502 from moving.

At this time, the four movable electrodes 511, 512, 513 and 514 make contact with the second insulating layers 531, 532, 533 and 534 formed on the four fixed electrodes, respectively.

In addition, as shown in FIG. 11, the four movable electrodes 511, 512, 513 and 514 connected to the second electrode 502 are connected to springs 551. Since the springs 551 are fixed to the substrate 800 shown in FIG. 10, the second electrode 502 may move upward from the first electrode so that a predetermined gap is formed between the first electrode and the second electrode 502.

Four springs 551 may be provided to allow the second electrode 502 to stably move upward from the first electrode.

In addition, the second electrode 502 may have a polygonal shape and the springs 551 can be connected to edges of the second electrode 502.

Figure 12A:
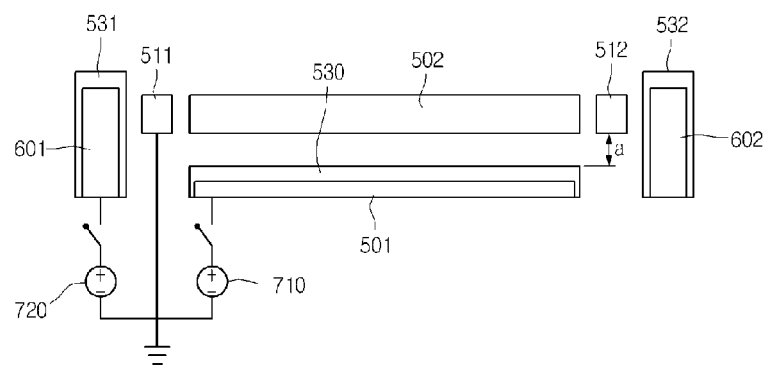
FIGS. 12a to 12c are schematic views for explaining a driving method for a MEMS variable capacitor according to the embodiment.
Figure 12B:
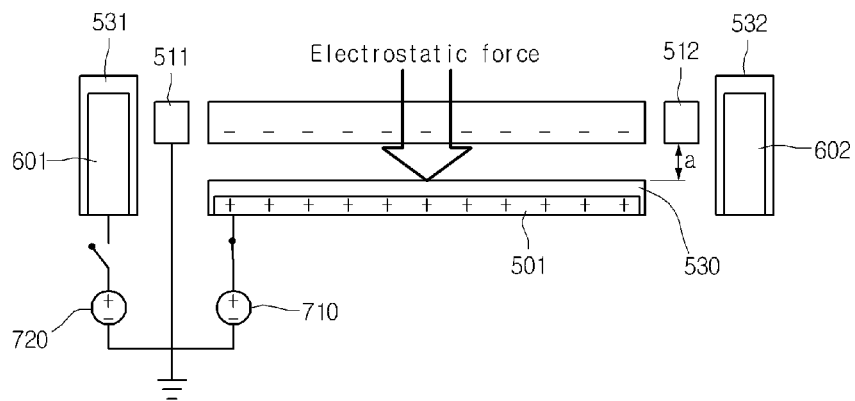
Figure 12C:
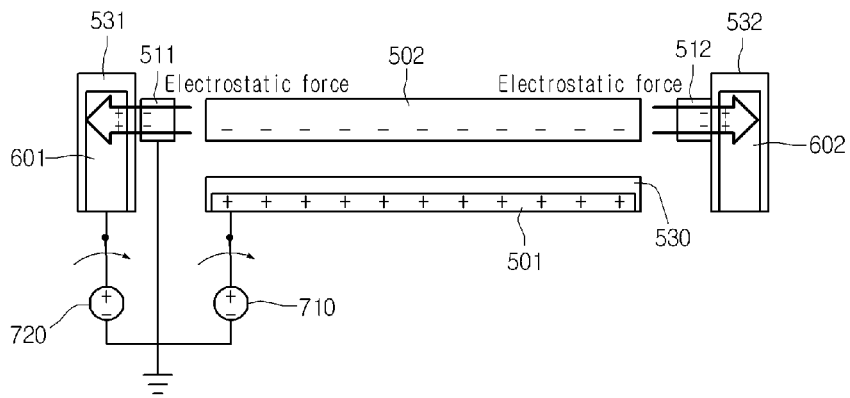

FIGS. 12a to 12c are schematic views for explaining a driving method for a MEMS variable capacitor according to the embodiment.

In order to drive the MEMS variable capacitor, the first electrode 501 is connected to a first power source 710, the fixed electrode 601 is connected to a second power source 720, and the movable electrode 511 is connected to the ground. As shown in FIG. 12a, if two fixed electrodes are provided, it is preferred to commonly connect the fixed electrodes 201 and 202 to the second power source 720. If four fixed electrodes are provided, the four fixed electrodes are commonly connected to the second power source 720.

According to the method for driving the MEMS variable capacitor, the voltage is applied from the first power source 710 to the first electrode 501, so the second electrode 502 is moved toward the first electrode 501 from the position shown in FIG. 12*a*. Thus, the gap between the first and second electrodes 501 and 502 is narrowed as shown in FIG. 12*b*.

In detail, as the voltage is applied to the first electrode 501, electrostatic force is generated between the first and second electrodes 501 and 502, so that the gap between the first and second electrodes 501 and 502 is varied to provide the capacitor having the desired capacitance value.

At this time, the gap between the first and second electrodes 501 and 502 is determined depending on the voltage applied to the first electrode 501.

If the voltage is constantly maintained between the first and second electrodes 501 and 502, the gap between the first and second electrodes 501 and 502 is constant so that the capacitance may not vary.

In addition, the voltage applied from the first power source 710 to the first electrode 501 must be lower than the pull-in voltage urging the second electrode 502 to be connected to the first electrode 501.

In detail, if the voltage applied from the first power source 710 to the first electrode 501 is higher than the pull-in voltage, the second electrode 502 is physically connected to the first electrode 501.

After that, the second power source 720 applies the voltage to the fixed electrode 601 so that the electrostatic force is generated between the fixed electrode 601 and the movable electrode 511. Thus, the movable electrode 511 is connected to the fixed electrode 601 (see, FIG. 12*c*).

At this time, since the second insulating layer 531 is formed on the fixed electrode 601, the electric short may not occur even if the fixed electrode 601 is connected to the movable electrode 511.

In addition, the voltage applied from the second power source 720 to the fixed electrode 601 must be higher than the pull-in voltage to allow the movable electrode 511 to be connected to the fixed electrode 601.

As shown in FIG. 12*c*, after the movable electrode 511 is connected to the fixed electrode 601, the RF signal may be transferred from the first electrode 501 to the second electrode 502 or vice versa.

Figure 13A:
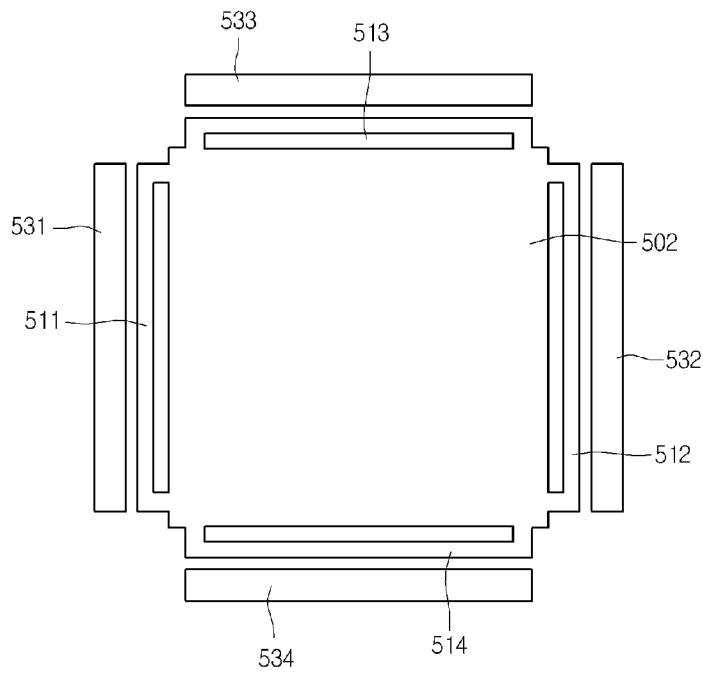
FIGS. 13a and 13b are schematic plan views for explaining a driving method for a MEMS variable capacitor according to the embodiment.
Figure 13B:
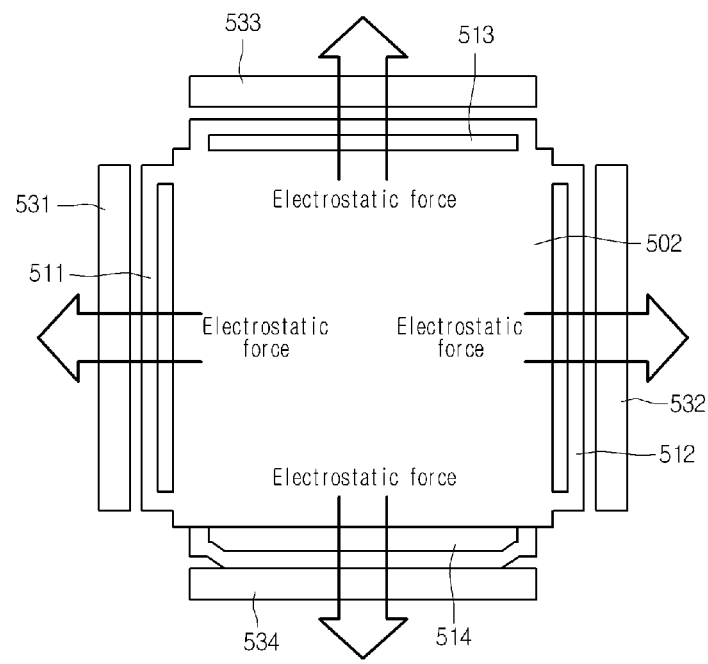

FIGS. 13*a* to 13*c* are schematic plan views for explaining a driving method for a MEMS variable capacitor according to the embodiment.

When viewed from the top, the first electrode is aligned below the second electrode, so the first electrode is not shown. In addition, the fixed electrode is surrounded by the second insulating layers 531, 532, 533 and 534, so the fixed electrode is not shown.

At this time, as described above, at the initial stage in which the voltage is not applied to the first electrode (reference numeral is omitted) and the fixed electrode (reference numeral is omitted) of the MEMS variable capacitor, the gap is constantly maintained between the first electrode and the second electrode 502 and the fixed electrodes are spaced apart from the movable electrodes 511, 512, 513 and 514 as shown in FIG. 13*a*.

After that, the voltage is applied to the first electrode to obtain the desired capacitance by adjusting the gap between the first electrode and the second electrode 502 (see, FIG. 13*b*).

Then, the voltage is applied to the fixed electrode, so that the movable electrodes are connected to the fixed electrodes.

Figure 14:
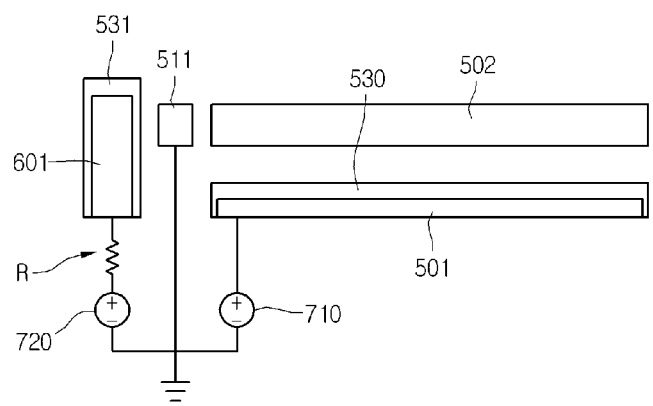
FIG. 14 is a schematic view for explaining a state in which resistance for blocking an RF signal is formed in a MEMS variable capacitor according to the embodiment.
Figure 15:
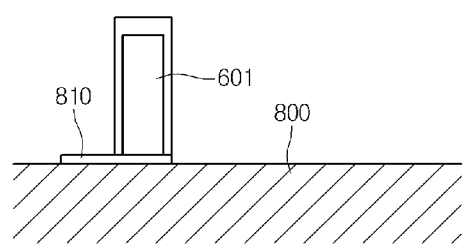
FIG. 15 is a partial sectional view showing formation of resistance for blocking an RF signal according to the embodiment.

FIG. 14 is a schematic view for explaining a state in which resistance for blocking an RF signal is formed in a MEMS variable capacitor according to the embodiment, and FIG. 15 is a partial sectional view showing formation of resistance for blocking the RF signal according to the embodiment.

According to the MEMS variable capacitor of the embodiment, the RF signal flows from the first electrode 501 to the second electrode 502 or vice versa, and then passes through the capacitor including the first electrode 501, the air layer and the second electrode 502.

At this time, the RF signal may flow to the movable electrode 511 aligned at the lateral side of the second electrode 502. Such a leakage of the RF signal may distort the RF signal characteristics.

For this reason, preferably, the resistance R is provided between the fixed electrode 601 and the second power source 720 to block the RF signal.

In detail, as shown in FIG. 14, the voltage is applied from the second power source 720 to the fixed electrode 601 through the resistance R for blocking the RF signal.

For instance, in order to form the resistance R for blocking the RF signal, as shown in FIG. 15, a SiC layer 810 is formed on the substrate 800 and the fixed electrode 601 is formed on the SiC layer 810. Then, the second power source 720 is connected to the SiC layer 810.

Figure 16:
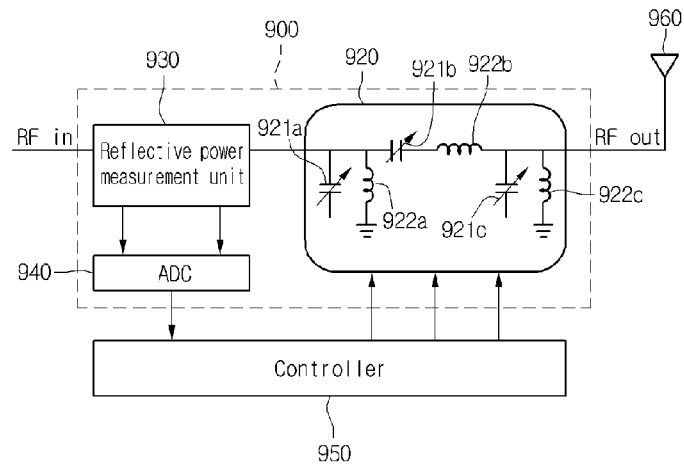
FIG. 16 is a view showing the structure of a tuner module employing a variable capacitor according to the related art.

FIG. 16 is a view showing the structure of a tuner module employing a variable capacitor according to the related art.

As shown in FIG. 16, the tuner module according to the related art may include a variable device module 920, a reflective power measurement unit 930 to measure intensity of a reflective wave from a receiving terminal, an ADC (analog-digital converter) 940 for converting the measured value of the reflective power measurement unit 930 into the DC voltage value, a controller generating control signals for variable devices based on the reflective power measurement value of the ADC to transfer the control signals to the variable device module 920, and an antenna 960 for transmitting/receiving the signals.

The variable device module 920 may include a plurality of variable capacitors 921*a*, 921*b* and 921*c* and a plurality of fixed inductors 922*a*, 922*b* and 922*c*. The number and connection wires for the variable capacitors 921*a*, 921*b* and 921*c* and the fixed inductors 922*a*, 922*b* and 922*c* may vary depending on the embodiments. The variable capacitors 921*a*, 921*b* and 921*c* and the fixed inductors 922*a*, 922*b* and 922*c* may form the time constant of devices equipped with the tuner module 900.

The values of the variable capacitors 921*a*, 921*b* and 921*c* may vary according to the DC voltage applied from the controller 950 and the RF signal value of the reflective wave of the signal transmitted to the receiving terminal (that is, the counterpart) is changed according to the values of the variable capacitors 921*a*, 921*b* and 921*c*. If the intensity of the RF signal of the reflective wave is high, the impedance matching is not carried out. That is, the impedance matching may be facilitated as the intensity of the reflective wave becomes reduced.

The controller 950 applies the control signals of the variable capacitors 921*a*, 921*b* and 921*c* based on the reflective power measurement values to perform the impedance matching by changing the impedance value of the variable device module 920.

The reflective power measurement unit 930 may include a directional coupler.

Figure 17A:
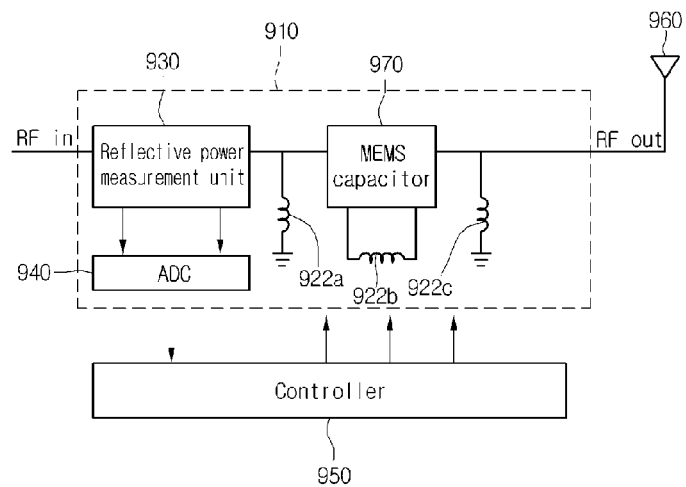
FIGS. 17a and 17b are views showing the structure of an impedance matching device employing a MEMS according to the embodiment.
Figure 17B:
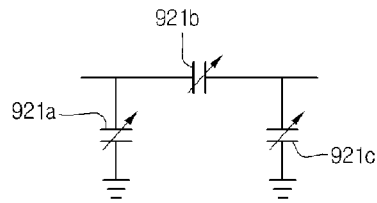

According to one embodiment, all variable capacitors or a part of the variable capacitors may constitute the MEMS device. FIGS. 17a and 17b are views showing the structure of a tuner module employing the MEMS according to the embodiment.

Hereinafter, the impedance matching device according to one embodiment will be described.

As shown in FIG. 17a, the impedance matching device 910 according to one embodiment includes a variable device unit having at least one variable MEMS capacitor 970 for converting the capacitance value according to the applied voltage, a fixed device unit having at least one inductors 922a, 922b or 922c to form a predetermined time constant together with the MEMS capacitor 970, the reflective power measurement unit 930 for measuring the intensity of the transmitted reflective wave signal by using the variable device unit and the fixed device unit, and a converting unit 940 for converting the intensity of the reflective wave signal measured by the reflective power measurement unit 930 into the DC voltage value to output the DC voltage value.

The MEMS capacitor 970, the inductors 922a, 922b and 922c, the reflective power measurement unit 930 and the converting unit 940 may be mounted on one substrate in the form of a package. The substrate may include a PCB substrate.

The MEMS capacitor 970 may include a circuit consisting of variable capacitors 921a, 921b and 921c as shown in FIG. 17b, in which each of the variable capacitors 921a, 921b and 921c may include at least one MEMS structure. For instance, each of the variable capacitors 921a, 921b and 921c can be prepared as the MEMS capacitor shown in FIGS. 2, 5a, 5b and 9.

The controller 950 may apply the DC voltage to the MEMS capacitor based on the DC voltage value input from the converting unit 940. The capacitor value of the MEMS capacitor 970 may vary depending on the DC voltage value so that the RF signal value of the reflective wave of the signal transmitted to the receiving terminal (that is, the counterpart) is changed. The impedance matching can be performed by adjusting the RF signal value to the maximum value.

Referring to FIG. 17a, the package consisting of the MEMS capacitor 970, the inductors 922a, 922b and 922c, the reflective power measurement unit 930 and the converting unit 940 is connected to the controller 950 and the antenna 960, so that an antenna package of a portable communication device can be easily manufactured.

In this manner, according to the embodiment, the tuner module including a plurality of devices is prepared as one package so that the inefficiency of the suppliers and customers, which is caused because the construction or specification of the devices varies depending on manufacturers, can be removed.

Meanwhile, the embodiment can be applied to a portable mobile device, such as a mobile terminal including a tuner module described above.

Figure 18A:
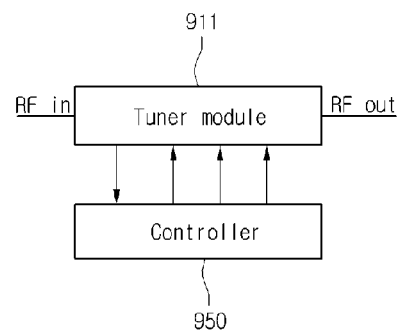
FIGS. 18a and 18b are views showing the structure of an impedance matching device employing a MEMS according to another embodiment.
Figure 18B:
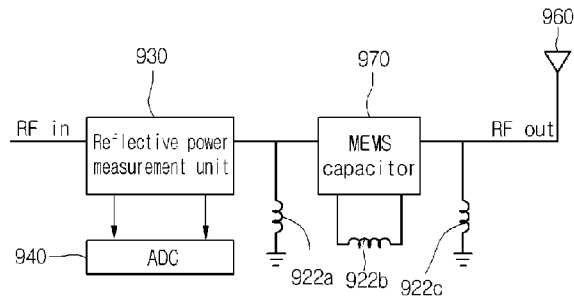

FIGS. 18a and 18b are views showing the structure of a tuner module a MEMS according to another embodiment.

As shown in FIG. 18a, the MEMS capacitor 970, the inductors 922a, 922b and 922c, the reflective power measurement unit 930 and the converting unit 940 may constitute one tuner module 911 as shown in FIG. 18b.

The MEMS capacitor 970 may include MEMS devices serving as a circuit including variable capacitors as shown in FIG. 17b. The MEMS capacitor 970, the inductors 922a, 922b and 922c, the reflective power measurement unit 930 and the converting unit 940 may be packaged on one substrate in the form of one component. Since the tuner module including a plurality of devices is prepared as one package, the inefficiency of the suppliers and customers, which is caused because the construction or specification of the devices varies depending on manufacturers, can be removed.

Figure 19A:
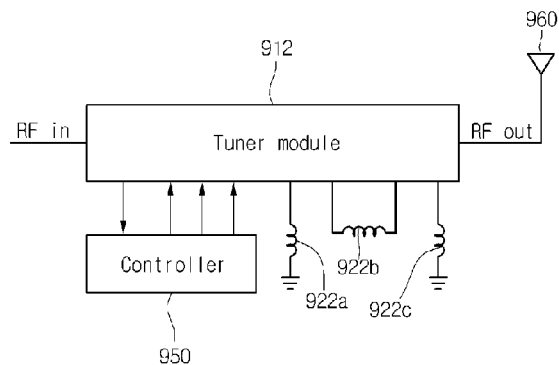
FIGS. 19a and 19b are views showing the structure of an impedance matching device employing a MEMS according to still another embodiment.
Figure 19B:
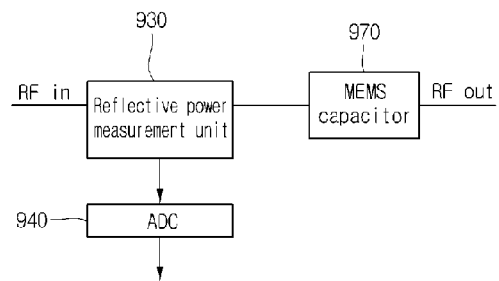

FIGS. 19a and 19b are views showing the structure of a tuner module employing a MEMS according to still another embodiment.

The tuner module 912 shown in FIG. 19a has the structure as shown in FIG. 19b. Referring to FIG. 19a, the tuner module 912 can be manufactured as one component by packaging the MEMS capacitor 970, the reflective power measurement unit 930 and the converting unit 940 in one substrate. The inductors 922a, 922b and 922c can be prepared as separate components.

Figure 20:
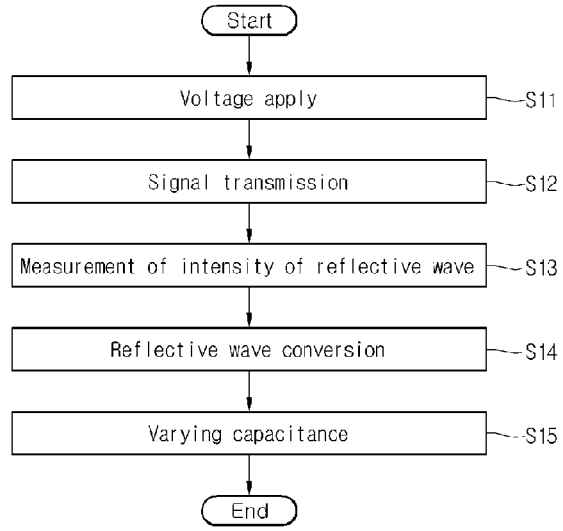
FIG. 20 is a flowchart showing the impedance matching method according to the embodiment.

FIG. 20 is a flowchart showing the impedance matching method according to the embodiment.

In step S11, the voltage is applied to the variable device unit including the MEMS variable capacitor. As the voltage is applied to the variable device unit, the MEMS variable capacitor has a predetermined capacitance according to the voltage. The voltage initially applied to drive the impedance matching device has a predetermined initial voltage value.

In step S12, the signal is transmitted by using the variable device unit and the fixed device unit. The fixed device unit includes at least one inductor and is coupled with the MEMS capacitor of the variable device unit to form a predetermined time constant.

In step S13, the reflective power measurement unit receives the reflective wave of the transmitted signal and measures the intensity of the reflective wave.

In step S15, the converting unit converts the reflective wave into the DC voltage value.

In step S16, the controller receives the DC voltage value, which is converted by the converting unit, and applies the voltage to the variable device unit based on the DC voltage value to vary the capacitance. That is, the capacitor value of the MEMS capacitor is changed according to the DC voltage value applied from the controller, so that the transmitted signal is also changed. Thus, the RF signal value of the reflective wave of the signal transmitted to the receiving terminal (that is, the counterpart) is changed. Thus, the impedance matching can be performed by adjusting the RF signal value to the maximum value.

The variable capacitor, the impedance matching device including the same, the mobile terminal and the impedance matching method according to the embodiment have been described above. The embodiment is also applicable to the antenna to which the impedance matching has been performed by the impedance matching device according to the embodiment.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An impedance matching device comprising:
a substrate;
a variable device unit mounted on the substrate and including at least one MEMS variable capacitor to change a capacitance value according to applied voltage;
a fixed device unit mounted on the substrate and including at least one inductor coupled with the MEMS variable capacitor to form a predetermined time constant;
a reflective power measurement unit mounted on the substrate to measure an intensity of a reflective wave of a signal transmitted from the variable device unit and the fixed device unit; and
a converting unit mounted on the substrate to output a direct current voltage value by converting the intensity of the reflective wave of the signal measured by the reflective power measurement unit into the direct current voltage value;
wherein the MEMS variable capacitor comprises:
 a first electrode;
 a second electrode floating above the first electrode;
 a fixed electrode spaced apart from a lateral side of the second electrode; and
 a movable electrode interposed between the second electrode and the fixed electrode and connected to the second electrode to physically make contact with the fixed electrode as voltage is applied to the fixed electrode; and
wherein a first insulating layer is formed on the first electrode to inhibit an electrical short between the first electrode and the second electrode, and a second insulating layer is formed on the fixed electrode to inhibit an electrical short between the fixed electrode and the movable electrode.

2. The impedance matching device of claim 1, wherein the reflective power measurement unit includes a directional coupler.

3. The impedance matching device of claim 1, wherein a gap between the first and second electrodes is adjusted by varying voltage applied to the first electrode.

4. The impedance matching device of claim 1, wherein the first electrode and the fixed electrode are formed on a substrate, and the second electrode and the movable electrode are connected to a spring fixed to the substrate so that the second electrode floats above the first electrode.

5. The impedance matching device of claim 1, wherein each of the fixed electrode and the movable electrode includes a pair of electrodes or four electrodes located at both sides of the second electrode.

6. The impedance matching device of claim 1, wherein the second electrode floats above the first electrode by a spring structure.

7. An impedance matching device comprising:
a substrate;
a variable device unit mounted on the substrate and including at least one MEMS variable capacitor to change a capacitance value according to applied voltage;
a fixed device unit mounted on the substrate and including at least one inductor coupled with the MEMS variable capacitor to form a predetermined time constant;
a reflective power measurement unit mounted on the substrate to measure an intensity of a reflective wave of a signal transmitted from the variable device unit and the fixed device unit; and
a converting unit mounted on the substrate to output a direct current voltage value by converting the intensity of the reflective wave of the signal measured by the reflective power measurement unit into the direct current voltage value, wherein the MEMS variable capacitor comprises:
 a first electrode;
 a second electrode spaced apart from the first electrode;
 a third electrode floating above the first and second electrodes;
 fourth electrodes connected to the third electrode through a spring structure; and
 fifth electrodes formed in opposition to the fourth electrodes and configured to variably adjust a capacitance value of the MEMS variable capacitor;
wherein when a voltage is applied to the fifth electrodes, a distance between the third electrode and the first and second electrodes is increased in response to the applied voltage, and
wherein the third electrode is vertically disposed between the fifth electrode and a collection of the first, second, and fourth electrodes.

8. The impedance matching device of claim 7, further comprising a support structure to fix a part of the spring structure.

9. The impedance matching device of claim 8, wherein the spring structure, the support structure, the fourth electrodes and the fifth electrodes are prepared as pairs, respectively, the pair of the spring structures are connected to end portions of both lateral sides of the third electrodes and the pair of the fourth electrodes, parts of the pair of the spring structures are fixed by the pair of the support structures, and the fifth electrodes are aligned in opposition to the fourth electrodes.

10. The impedance matching device of claim 9, wherein the pair of support structures are driven in a seesaw action as voltage is applied from the fifth electrodes to the fourth electrodes so that the third electrode moves upward from the first and second electrodes.

* * * * *